United States Patent
Xu et al.

(10) Patent No.: US 8,617,935 B2
(45) Date of Patent: Dec. 31, 2013

(54) BACK SIDE ALIGNMENT STRUCTURE AND MANUFACTURING METHOD FOR THREE-DIMENSIONAL SEMICONDUCTOR DEVICE PACKAGES

(75) Inventors: Jianwen Xu, San Diego, CA (US); Zhiwei Gong, Chandler, AZ (US); Scott M. Hayes, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 309 days.

(21) Appl. No.: 13/220,891

(22) Filed: Aug. 30, 2011

(65) Prior Publication Data

US 2013/0052777 A1    Feb. 28, 2013

(51) Int. Cl.
*H01L 21/56* (2006.01)

(52) U.S. Cl.
USPC ..... 438/127; 438/126; 438/401; 257/E21.502

(58) Field of Classification Search
USPC .......................... 438/126, 127, 401
See application file for complete search history.

(56) References Cited

U.S. PATENT DOCUMENTS

| | | | |
|---|---|---|---|
| 4,918,811 A | 4/1990 | Eichelberger et al. | |
| 5,032,543 A | 7/1991 | Black et al. | |
| 5,144,747 A | 9/1992 | Eichelberger | |
| 5,250,843 A | 10/1993 | Eichelberger | |
| 5,602,567 A | 2/1997 | Kanno | |
| 5,866,952 A | 2/1999 | Wojnarowski et al. | |
| 6,159,767 A | 12/2000 | Eichelberger | |
| 6,300,670 B1 | 10/2001 | Kramer et al. | |
| 6,555,441 B2 | 4/2003 | Ouellet | |
| 6,838,689 B1 | 1/2005 | Deng et al. | |
| 6,869,829 B2 | 3/2005 | Hikita et al. | |
| 7,029,949 B2 | 4/2006 | Farnworth et al. | |
| 7,078,788 B2 | 7/2006 | Vu et al. | |
| 2005/0158009 A1 | 7/2005 | Eichelberger et al. | |
| 2006/0055020 A1* | 3/2006 | Bolken et al. | 257/686 |
| 2006/0273469 A1 | 12/2006 | Beer et al. | |
| 2007/0205513 A1 | 9/2007 | Brunnbauer et al. | |
| 2007/0216004 A1 | 9/2007 | Brunnbauer et al. | |
| 2009/0166061 A1* | 7/2009 | Yoo et al. | 174/250 |
| 2010/0314746 A1* | 12/2010 | Hsieh et al. | 257/692 |
| 2011/0198762 A1* | 8/2011 | Scanlan | 257/793 |
| 2011/0241708 A1* | 10/2011 | Chen | 324/691 |
| 2012/0329212 A1* | 12/2012 | Leal | 438/110 |
| 2013/0127029 A1* | 5/2013 | Lee et al. | 257/675 |

FOREIGN PATENT DOCUMENTS

WO    0233751 A2    4/2002
WO    2007120959 A2    10/2007

* cited by examiner

*Primary Examiner* — Alexander Ghyka
(74) *Attorney, Agent, or Firm* — Jonathan N. Geld

(57) ABSTRACT

A mechanism for accurate alignment of semiconductor package back side interconnect processing is provided. As semiconductor die are placed in position for an encapsulated panel, two or more alignment die having fiducial markings formed on the back, or non-active, side of those die are also placed in the panel. Once all the die and other components have been placed for the panel, the panel is encapsulated using an encapsulant. Excess encapsulant, if any, is removed by a process such as backgrinding. The back grinding process exposes the back side of the alignment die and the fiducial features on those alignment die. The fiducial features on the alignment die can then be used for alignment of backside processing operations on the panel.

20 Claims, 5 Drawing Sheets

BACK SIDE ALIGNMENT STRUCTURE AND MANUFACTURING METHOD FOR THREE-DIMENSIONAL SEMICONDUCTOR DEVICE PACKAGES

BACKGROUND

1. Field

This disclosure relates generally to semiconductor device packaging, and more specifically, to provide for alignment of features on a second side of a panel for double-sided processing of three-dimensional packages.

2. Related Art

As the size of electronic components becomes smaller and smaller, as does the size of devices containing those electronic components, density demands for electronic chip packaging become greater and greater. Three-dimensional packaging has emerged as a solution for achieving the higher densities of compound and necessitated by these small devices.

Through via process and double-sided processing are key elements to enable three-dimensional packages in a variety of packaging technologies (e.g., redistributed chip packaging (RCP) and flip chip packaging). After panel encapsulation, through vias can be formed by laser drilling or other techniques. The through vias are then filled with a conductor (e.g., conductive silver paste). The panel front and back sides are subsequently electrically connected using the through vias. Double-sided processing of interconnect structures can then be performed. On the side of the panel having die active surfaces, die pad contacts and other features can be used for dielectric mask alignment. On the opposite side of the panel (i.e., the panel back side), traditional methods provide only the through vias, filled with conductive silver paste or other conductive materials, as an alignment mechanism for mask alignment. But due to typically irregular through via shapes and poor contrast between via fill material and encapsulant material on the panel back side, mask alignment for back side dielectric processing is challenging.

Poor alignment of the back side processing results in decreased yields and increased costs. It is therefore desirable to have a process by which back side alignment is made more accurate, while not increasing costs due to additional equipment and process steps.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Figure 1:
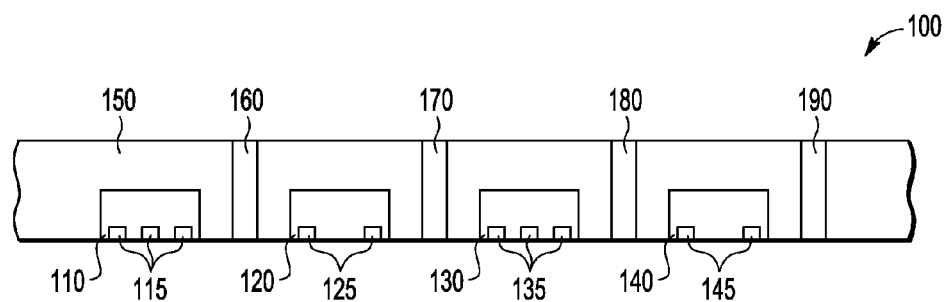
FIG. 1 is a simplified block diagram illustrating a cross-sectional view of a prior art device structure 100 at a stage in processing.

A mechanism for accurate alignment of semiconductor package back side interconnect processing is provided. Semiconductor die are accurately placed in position for an encapsulated panel by using, for example, a pick-and-place machine that is aligned to fiducial markings on the die or other features on the active side of the panel. As the die are placed in position for an encapsulated panel, two or more alignment die having fiducial markings formed on the back side (that is, non-active side) of those die are also placed in the panel. Once all the die and other components have been placed for the panel, the panel is encapsulated using an encapsulant. The panel is subsequently cured and then excess encapsulant is removed by a process such as backgrinding. The back grinding process exposes the back side of the alignment die and the fiducial features on those alignment die. Alternatively, the back side of alignment die can be exposed by controlling encapsulation thickness right at alignment die thickness without grinding (e.g., using compression molding).

The alignment die fiducial features provide a more accurate mechanism for back side processing alignment than through vias. Accuracy improvement is due to a number of reasons, including, for example, well-defined features provided by the engraving process, higher contrast between material filling the engraved features (e.g. encapsulant or another pre-encapsulation filling) and the back side surface of the alignment die, and the fixed alignment of the alignment die themselves. For embodiments in which the back side of the alignment die is not over encapsulated, the alignment features can be formed by engraving the alignment die and then pre-filling the features, if necessary, with a material that provides good contrast for an alignment detector.

For convenience of explanation, and not intended to be limiting, the present invention is described for semiconductor devices, but persons of skill in the art will understand that the present invention applies to any type of electronic or opto-electronic device that is substantially planar. Accordingly, such other types of devices including the non-limiting examples given below, are intended to be included in the terms "device," "semiconductor device," and "integrated circuit" whether singular or plural, and the terms "device," "die," and "chip" are intended to be substantially equivalent. Non-limiting examples of suitable devices are semiconductor integrated circuits, individual semiconductor devices, piezoelectric devices, solid-state filters, magnetic tunneling structures, integrated passive devices such as capacitors, resistors and inductors, and combinations and a raise of any and all of these types of devices and elements. Further, embodiments of the present invention do not depend upon the types of die or chips being used nor the materials of which they are constructed provided that such materials withstand the encapsulation process.

The following detailed description is merely exemplary in nature and is not intended to limit the invention or the application and uses of the invention. Furthermore, there is no intention to be bound by any expressed or implied theory presented in the preceding technical field, background, brief summary or the following detailed description. In some examples provided, the semiconductor packaging processes described are associated with redistributed chip packaging (RCP). It should be recognized that such examples are not intended to limit embodiments of the present invention to RCP methods, as embodiments of the present invention can be applied to other semiconductor packaging processes such as flip chip and ball grid array, for example.

FIG. 1 is a simplified block diagram illustrating a cross-sectional view of a prior art device structure 100 at a stage in processing. Semiconductor die 110, 120, 130, and 140, each having bond pads 115, 125, 135, and 140 respectively, are empanelled in an encapsulant 150. Through vias 160, 170, 180 and 190 are formed in the encapsulant and filled with a conductive material (e.g., silver paste).

As discussed above, front-side interconnect processing can be aligned using fiducials on embedded structures and contact pads of the semiconductor die. But the opposite, or "back," side of the panel (the "top" of the panel in FIG. 1) only has the through vias as features that can be used for alignment of a back-side interconnect processing.

One issue with using through vias for back side alignment is that the conductive material used for through vias can have poor contrast with the background created by the panel encapsulant. For example, on a microscopic scale, silica filler used in epoxy molding compound has a very similar color to the silver filler in through via paste. This can make it difficult for an optical image recognition system to recognize the presence of the through vias during alignment. Further, through via shapes can often be irregular due to deflection of the laser drill caused by silica filler in the encapsulant and also due to a high aspect ratio (depth to feature width) of the through via. These irregular shapes can increase difficulty of providing a good alignment for back side processing. Additionally, deflection of the laser drill and the high aspect ratio of the through vias can result in through vias that are not straight through the encapsulant. This can also result in poor alignment of back side processing when using through vias for alignment purposes.

Embodiments of the present invention address the back side alignment issue by providing a more accurate alignment "landmark" usable by optical image recognition systems when aligning back side interconnect processing.

Figure 2:
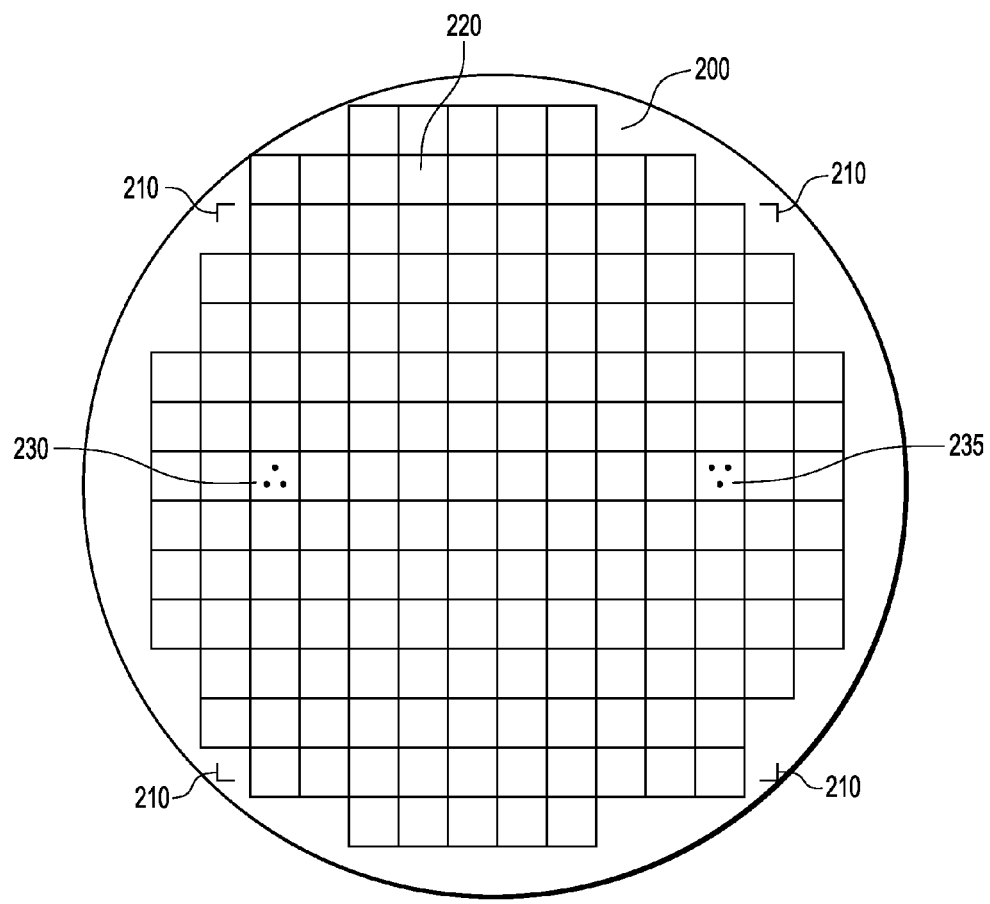
FIG. 2 is a simplified block diagram illustrating an example of a semiconductor package panel having alignment die, in accord with embodiments of the present invention.

FIG. 2 is a simplified block diagram illustrating an example of a semiconductor package panel having alignment die, in accord with embodiments of the present invention. The panel illustrated in FIG. 2 has a frame 200 that includes fiducials 210 used in placing die 220 in the panel. Placement of the die including die 220 can be performed by mechanisms known in the art, such as a pick-and-place machine. Locations of the various die are determined in relation to fiducials 210. Also placed in the panel are alignment die 230 and 235. As will be discussed more fully below, alignment die 230 and 235 have features on the back side of those die that can ultimately be used for alignment of panel back side processing operations.

While FIG. 2 illustrates two alignment die, it should be recognized that embodiments of the present invention are not limited to a particular number of alignment die. Increasing a number of alignment die can result in increasing confidence of alignment for back side processing. However, if the alignment die are non-functional (e.g., dummy die), then a balance may need to be struck between consuming panel die area for fiducials and providing greater accuracy for back side processing alignment. One solution to this issue may be to place alignment die in non-functional locations, such as toward an outer edge of the panel.

Figure 3:
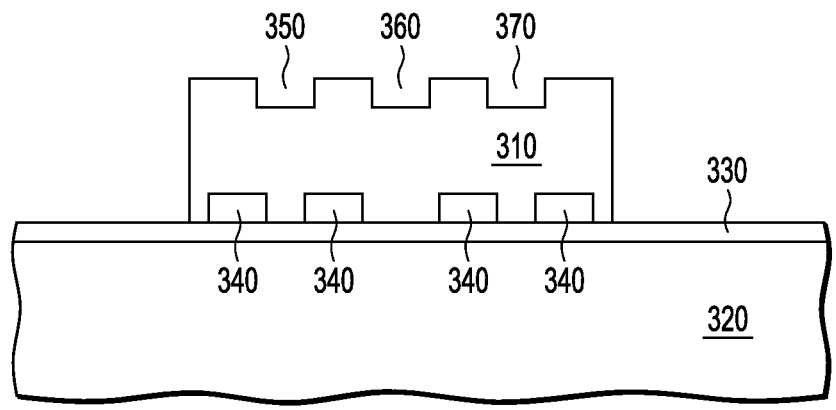
FIG. 3 is a simplified block diagram illustrating one example of a cross-section of an alignment die usable by embodiments of the present invention.

FIG. 3 is a simplified block diagram illustrating one example of a cross-section of an alignment die usable by embodiments of the present invention. An alignment die 310 is illustrated attached to a carrier 320 by an adhesive layer 330 (e.g. a double-sided tape). An active surface of alignment die 310 having pads 340 is shown facing the carrier. The back side (non-active side) of the alignment die is engraved with fiducial markings 350, 360 and 370.

In one embodiment, fiducial markings 350, 360 and 370 can be made by laser drilling the back side of alignment die 310 after the alignment die has been placed on the carrier. The alignment die can be an active die or a dummy die. An advantage of performing the laser drilling after placement of the die in the panel area is that the laser-drilled fiducial markings will have an accurate positioning in relation to panel geometry due to the placement of the die and alignment of the laser according to some fiducials of the panel frame or other features (e.g., fiducials 210). One disadvantage of performing the laser drilling after placement of the die is that an additional process step is needed beyond typical pick-and-place operations.

In an alternative embodiment, alignment die 310 can be pre-marked with fiducial markings 350, 360 and 370. For example, a dummy die made from a desired material can be prepared with the fiducial markings. The material used to make the dummy die can be chosen for high contrast with the material filling the fiducial markings. For example, a dummy die can be made using copper or silicon coated, knowing that the chosen material has a high contrast with the encapsulant material that would fill the fiducial markings. Further, when using pre-marked die, the fiducial markings can be formed using a variety of methods such as molding, as well as laser drilling. Using pre-marked die avoids having the additional drilling process step beyond typical pick-and-place operations. One potential drawback of using pre-marked die is a possibility of lower accuracy in the location of the fiducial markings due to shifting or rotation of the alignment die relative to live components, for example.

Figure 4:
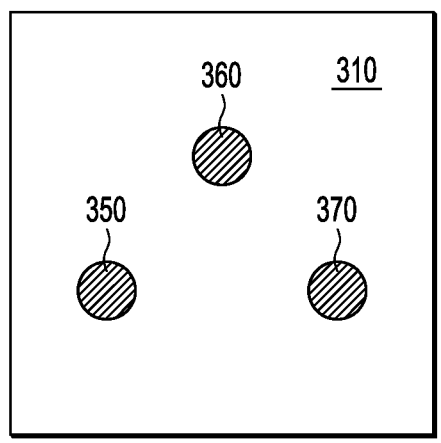
FIG. 4 is a simplified block diagram illustrating one example of the top of the alignment die.

FIG. 4 is a simplified block diagram illustrating one example of the top of an alignment die usable by embodiments of the present invention. Alignment die 310 is shown with fiducial markings 350, 360 and 370. While FIG. 4 illustrates fiducial markings as circles, it should be understood that any shapes, sizes and orientations of fiducial markings can be provided within the area of the back side of alignment die 310 (e.g., "donuts,", crosses, and the like). The selected shape, size and orientation of the fiducial markings may be dictated by the application or the equipment being used for optical image recognition.

It is expected that when a panel including alignment die is encapsulated, encapsulant material will fill the alignment die fiducial markings. Once exposed, contrast between the encapsulant material filling the fiducial markings and the material of the alignment die aids in the optical image recognition of the fiducial markings when performing back side alignment. Since, in one embodiment, the alignment die fiducials are exposed by backgrinding the panel, the depth of the fiducial markings should be such that the markings will not be eliminated by the backgrinding and that the backgrinding will not pull the encapsulant filling the fiducial markings out of those markings. In one embodiment, the fiducial markings are formed with a depth such that the after-grind depth of the fiducial markings is greater than 50μ.

Figure 5:
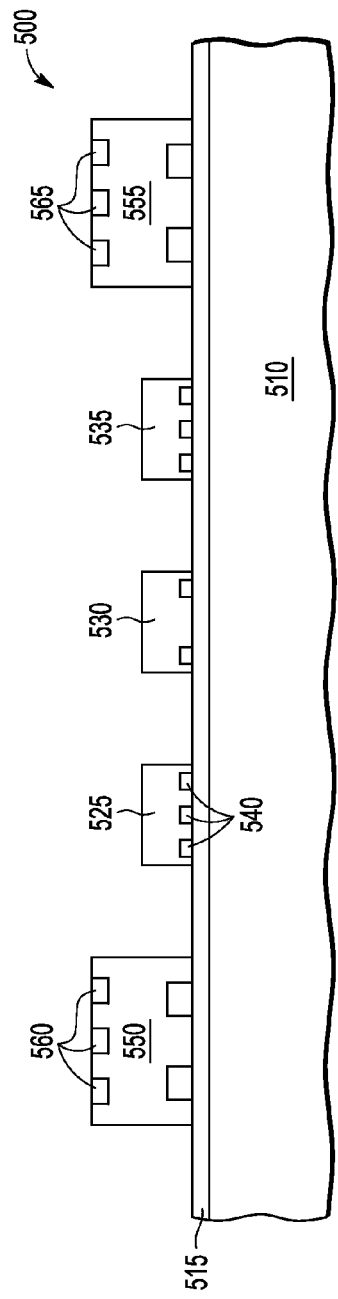
FIG. 5 is a simplified block diagram illustrating a cross-sectional view of a device structure at a stage in one example of processing, according to an embodiment of the present invention.

FIG. 5 is a simplified block diagram illustrating a cross-sectional view of a device structure 500 at a stage in one example of processing, according to an embodiment of the present invention. A carrier 510 is provided with an adhesive layer 515. Adhesive layer 515 can be of a standard type used in semiconductor packaging processing, including, for example, a double-sided polyimide sticky tape having a silicone adhesive on both sides. The adhesive layer should be of a type that can withstand the packaging processing without becoming brittle or permanently fixed in place, since at a later point in processing the tape will be separated from the package.

Semiconductor die 525, 530 and 535 are placed active surface face down on adhesive layer 515. The "active surface" of semiconductor die 525 is a surface of the die having bond pads 540. Alignment die 550 and 555 are also placed active surface face down on adhesive layer 515. Fiducial markings 560 and 565 are formed on alignment die 550 and 555, respectively. As discussed above, fiducial markings 560 and 565 can be formed either subsequent to placement of alignment die 550 and 555 on the carrier or can be pre-marked on the alignment die. As illustrated, alignment die 550 and 555 have a greater height than semiconductor die 525, 530 and 535. While it is not necessary for the alignment die to have a greater height than the other semiconductor die, it should be appreciated that the alignment die should be at least as high as the semiconductor die since the fiducial markings are exposed either through a back grinding process or other means. Further, it may not be desirable to subject semiconductor die 525, 530 and 535 to exposure through backgrinding or other means for other reasons (e.g. changes in performance effects). In addition, if the alignment die are "dummy die," the alignment die will not have an "active" surface. In this case, the surface placed down on the adhesive layer will be the surface opposite the surface having fiducial markings.

Figure 6:
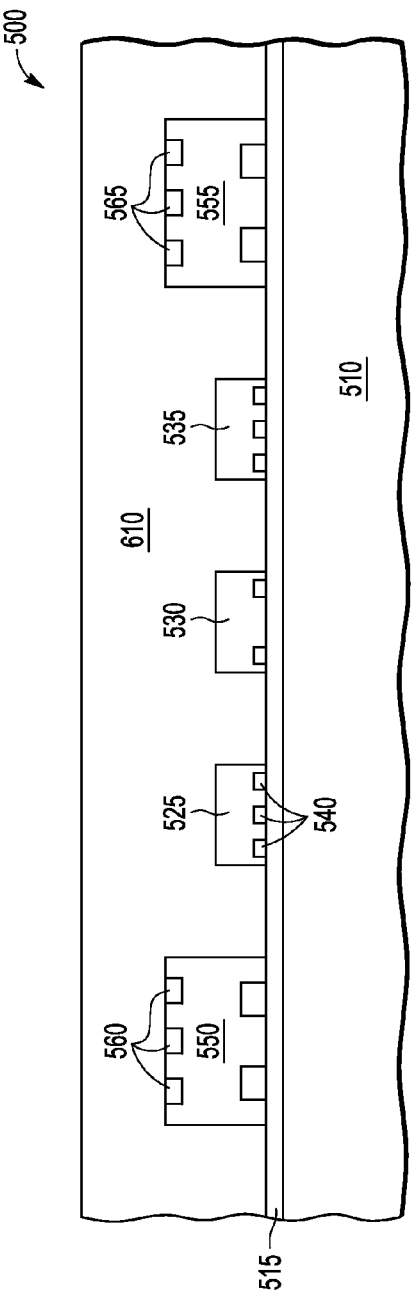
FIG. 6 is a simplified block diagram illustrating the cross sectional view of the device structure at a later stage in the processing example.

FIG. 6 is a simplified block diagram illustrating the cross sectional view of device structure 500 at a later stage in the processing example. A molding material is applied to the structures affixed to adhesive layer 515 (e.g., die 525, 530, and 535, and alignment die 550 and 555), forming an encapsulant 610 that encapsulates the structures within the molding material and forms a panel. The molding material can be any appropriate encapsulant including, for example, silica-filled epoxy molding compounds, plastic encapsulation resins, and other polymeric materials such as silicones, polyimide, phenolics, and polyurethanes. The molding material can be applied by a variety of standard processing techniques used in encapsulation including, for example, printing, pressure molding and spin application. Once the molding material is applied, the panel can be cured by exposing the materials to certain temperatures for a period of time, or by applying curing agents, or both. In a typical encapsulation process, a depth of encapsulant 610 exceeds a maximum height of structures embedded in the molding material (e.g., the height of alignment die 550 and 555 as illustrated in FIG. 6).

Figure 7:
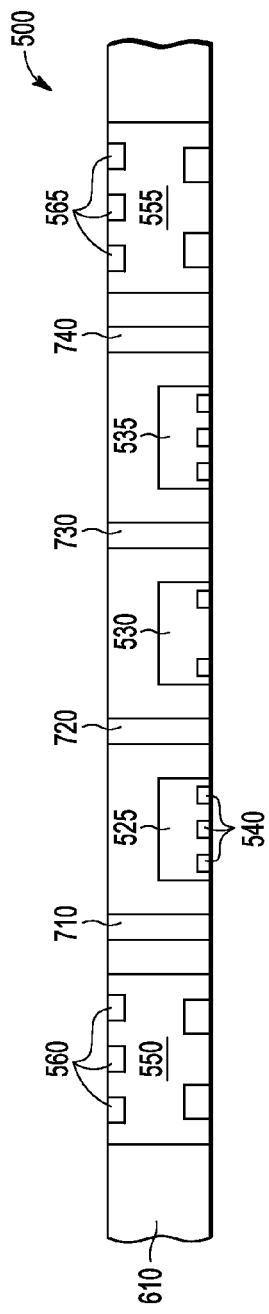
FIG. 7 is a simplified block diagram illustrating the cross sectional view of the device structure at a later stage in the processing example.

FIG. 7 is a simplified block diagram illustrating the cross sectional view of device structure 500 at a later stage in the processing example. Encapsulant 610 has been reduced in thickness to expose the back sides of alignment die 550 and 555. This reduction in thickness of the encapsulant and exposing the alignment die (and fiducial markings on the alignment die) can be performed by a grinding process, laser ablation, or other conventional techniques (e.g., back grinding) that will expose the back sides of the alignment die without removing the material filling the fiducial markings on the alignment die (e.g., encapsulant).

One alternative to the process of encapsulation and back-grinding is to mold the encapsulant to the height of alignment die 550 and 555. In this manner, the fiducials on the alignment die are not covered by encapsulant. Grinding or other methods for reducing the thickness of the encapsulant are not needed to expose the fiducial markings on the alignment die as they remain exposed during the encapsulation process. In this embodiment, the fiducial markings can be formed as discussed above, and can be pre-filled with a material to create a greater contrast between the fiducial marking and the surface material of the alignment die. In addition, fiducial markings for this embodiment can be formed without creating a hole through drilling or marking (e.g., printing or other surface marking).

The encapsulated panel is removed from adhesive layer 515 (and carrier 510). Once released from the adhesive layer, the side of the panel previously attached to the tape (the "active" side of the panel) can be cleaned to remove any excess adhesive remaining attached to the encapsulated panel. This process of tape release and clean exposes all the contacts on the bottom side of the panel, including bond pads 540, that can include fiducial markings.

FIG. 7 also illustrates through vias 710, 720, 730, and 740. In one embodiment, the through vias can be formed by laser drilling through encapsulant 610 and then filling the through vias with a conductive metal (e.g., silver paste). Other methods for drilling and other materials can be used for filling the through via holes, as required by the application. The through vias can be used, for example, to enable electrical connection between interconnect structures or pads formed on the bottom and top of packages formed from the panel.

Figure 8:
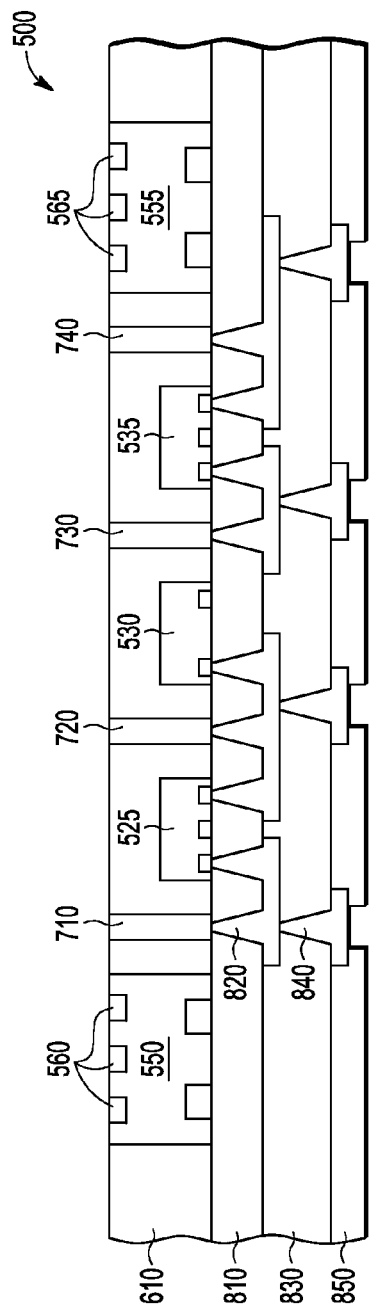
FIG. 8 is a simplified block diagram illustrating the cross sectional view of the device structure after active-side processing.

FIG. 8 is a simplified block diagram illustrating the cross sectional view of device structure 500 after active-side processing (e.g., buildup). Processing providing the various layers illustrated in FIG. 8 can be provided by standard techniques used in semiconductor packaging.

An insulating layer 810 can be deposited over the active surface of the encapsulated die, through vias, and encapsulation molding material. Insulating layer 810 can be made from organic polymers, for example, in liquid or dry film and can include a wide range of other materials used for interlayer dielectrics as known in the art (e.g., silicon dioxide, silicon nitride, silicon and oxynitride, or any combination of such layers providing electrical isolation). Insulating layer 810 is patterned to expose bond pads found on the active semiconductor die (e.g., bond pads 540), as well as the ends of the through vias. As discussed above, alignment of the masking for insulating layer 810 can be provided by fiducial markings on bond pad locations on semiconductor die or other features on the panel, for example.

A conductive layer 820 can then be deposited to provide an interconnect between the bond pads and signal conduits. Conductive layer 820 can include materials such as metal, metal alloy, doped semiconductor, semi-metals, or combinations thereof as known in the art (e.g. amorphous silicon, doped polysilicon, aluminum, copper, tantalum, titanium, tungsten, or any metal alloy, nitride or silicide). Through the use of the conductive layer, any number of bond pads can be interconnected in any combination to the same or other die and to the through vias. The interconnect illustrated in FIG. 8 is provided only by way of example, and it should be realized that the interconnects formed by conductive layer 820 and other conductive layers discussed below can extend not only across the page as illustrated but also into and above the page.

An additional interconnect layer can be provided by forming additional insulating layers (e.g., insulating layer 830) and patterning those insulating layers to receive additional conductive layers (e.g., conductive layer 840). The range of materials that can be used for subsequent insulating layers and conductive layers can include those listed for insulating layer 810 and conductive layer 820, and each type of layer can be the same or different materials as required by the nature of the application. Further, as illustrated, an insulating layer 850 can be formed, patterning that layer to expose pads formed in conductive layer 840 to receive conductive balls, for example, at a later stage.

Figure 9:
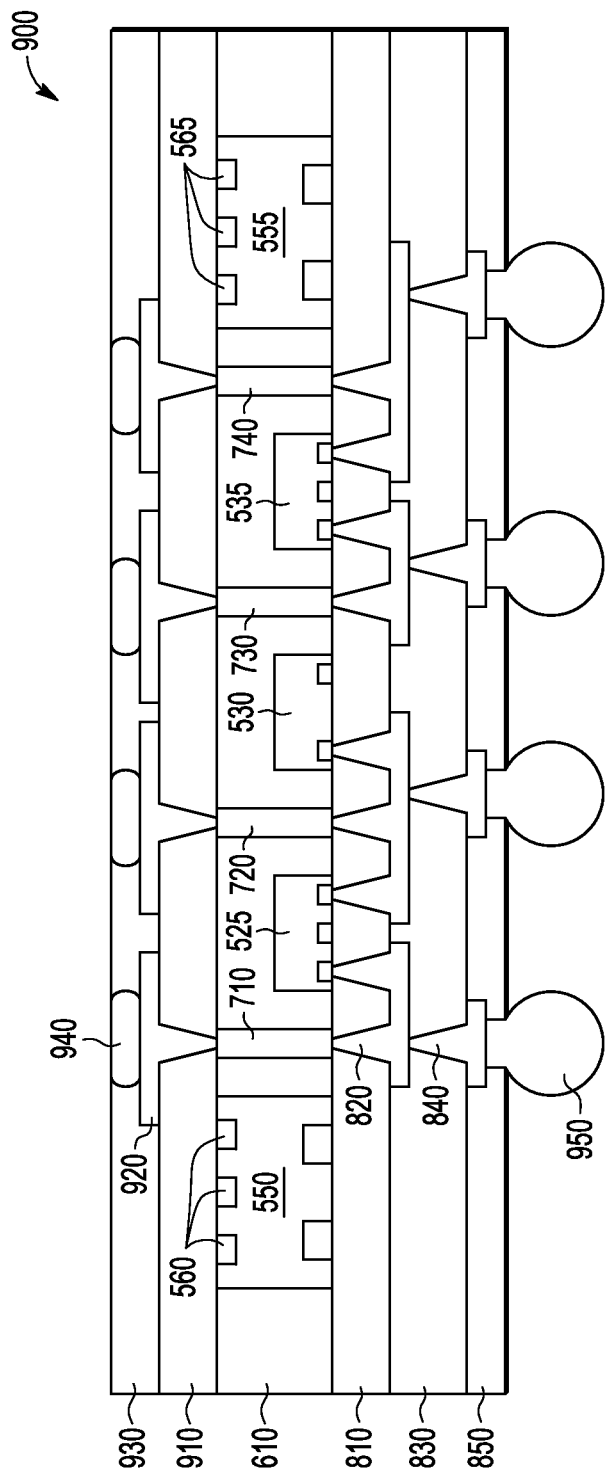
FIG. 9 is a simplified block diagram illustrating the cross sectional view of the device structure after an interconnect is provided on the back side of the package, forming a double-sided semiconductor package.

FIG. 9 is a simplified block diagram illustrating the cross sectional view of device structure 500 after an interconnect is provided on the back side of the package, forming a double-sided semiconductor package. Through vias 710, 720, 730 and 740 allow for connections to be made between the active-side interconnect described above with regard to FIG. 8 and the back side interconnect. Again, the back side interconnect can be formed by standard techniques. For example, an insulating layer 910 can be formed over the back side surface of the through vias and encapsulation molding material.

The insulating layer is patterned to expose the ends of the through vias. As discussed above, patterning is performed using alignment die fiducials 560 and 565. An optical image recognition system is used to search for the fiducials on the panel back side and pattern masking is performed in response to the location of those alignment die fiducials.

A conductive layer 920 can then be used to form an interconnect, which can be patterned and etched as required by the application. Subsequent insulating layers (e.g., insulating layer 930) and conductive layers can be formed as required by the application. FIG. 9 illustrates a set of openings 940 formed over conductive layer 920 to define a pattern to receive other packages and components on the back side of the package. Also, after processing of active and back side interconnects, a set of conductive balls 950 can be mounted on the pad openings defined by conductive layer 840 and insulating layer 850. Individual semiconductor packages then can be separated from the panel using a singulation process.

Embodiments of the present invention are not limited to the particular type of process illustrated in the figures. As shown, embodiments of the present invention are used in a fan-out wafer level package, (e.g. redistributed chip packaging process (RCP)), but embodiments of the present invention are not limited to fan-out wafer level package. For example, the advantages provided by embodiments of the present invention can be realized in BGA, as well as flip chip processes. It should be realized, however, that steps discussed above may require modification for different types of processes. Further, embodiments of the present invention are illustrated as a buildup process, but embodiments of the present invention are not limited to buildup. For example, lamination or other technique can be used for front and back side interconnect processing.

The processes of the present invention provides for an accurate mechanism of aligning front to back side features. Alignment die are placed in alignment with the front side of a package, while the fiducial markings assist in alignment of the back side features. This alignment mechanism avoids additional process steps and provides a passive means for alignment that avoids more expensive alternatives, such as double-sided alignment tools that examined both sides of a panel to make alignment decisions.

By now it should be recognized that in one embodiment of the present invention a method for packaging integrated circuit die is provided that includes forming a panel having first and second major surfaces including a plurality of integrated circuit die and a plurality of alignment die that have fiducial markings on a major surface, encapsulating the plurality of integrated circuit die in the panel with an active surface of each integrated circuit die being exposed at the first major surface of the panel, and encapsulating the plurality of alignment die in the panel with the major surface of the alignment die being exposed at the second major surface of the panel such that the fiducial markings are exposed at the second major surface of the panel. In this embodiment, the encapsulating of the alignment die is performed using an encapsulant.

One aspect of the above embodiment further includes exposing the major surface of the alignment die resulting in the alignment die fiducials being filled with encapsulant. In a further aspect, exposing the major surface of the alignment die is performed using a backgrind operation in which the backgrind is performed to a depth sufficient to expose the major surface of the alignment die and less than a depth of the fiducial markings on the major surface of the alignment die. In another further aspect, the major surface of the alignment die includes a material having high contrast with the encapsulant filling the fiducials. In a further aspect of the above aspect, the major surface material of the alignment die can be one of silicon, metal, and a dielectric. In still another further aspect, prior to the exposing of the major surface of the plurality of alignment die, the plurality of alignment die have a thickness between the major surface of the alignment die and the first major surface of the panel that is greater than a thickness of the panel between the first and second major surfaces of the panel subsequent to exposing.

Another aspect of the above embodiment further includes exposing the major surface of the alignment die by performing the encapsulating of the plurality of alignment die such that the encapsulation thickness is the alignment die thickness. In a further aspect, the fiducial markings are formed using one of the laser drilling, engraving, or molding. Another aspect further includes pre-filling the fiducial markings with a material that provides a high contrast with the major surface of the alignment die.

Another aspect of the above embodiment further includes placing the plurality of alignment die in a plurality of corresponding areas for the panel and forming the fiducial markings on the major surface of each of the alignment die subsequent to performing the placing. In a further aspect, forming the fiducial markings is performed using a laser drill. In another further aspect, forming the fiducial markings provides fiducial markings having an aspect ratio of a width of the fiducial markings to a depth of the fiducial markings of less than one.

In another aspect of the above embodiment, forming the panel further includes placing the plurality of alignment die in a plurality of corresponding areas for the panel, wherein the fiducial markings are provided on the alignment die prior to the placing. In a further aspect, the alignment die are molded with the fiducial markings.

In another aspect of the above embodiment, the plurality of alignment die have a thickness between the major surface of the alignment die and the first major surface of the panel that is greater than a thickness of the plurality of integrated circuit die. In another aspect of the above embodiment, the plurality of alignment die includes two alignment die. In another aspect of the above embodiment, the alignment die can be either active die having an active surface opposing the major surface of the alignment die or dummy die having no active surface opposing the major surface of the alignment die.

Another aspect of the above embodiment further includes filling the alignment die fiducials with a material having an optical contrast with a material comprising the major surface of the alignment die. This filling of the alignment die fiducials is performed prior to encapsulating the plurality of alignment die in the panel.

Yet another aspect of the above embodiment further includes forming a dielectric layer over the second major surface of the panel, forming a plurality of holes in the dielectric layer to expose conductive structures accessible on the second major surface of the panel, and forming one or more electrical interconnects over the second major surface of the panel using the plurality of holes. Forming the plurality of holes is performed using the alignment die fiducial markings for alignment of the holes.

Because the apparatus implementing the present invention is, for the most part, composed of electronic components and circuits known to those skilled in the art, circuit details are not explained in any greater extent than that considered necessary as illustrated above, for the understanding and appreciation of the underlying concepts of the present invention and in order not to obfuscate or distract from the teachings of the present invention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging integrated circuit die, the method comprising:
    forming a panel comprising
        one or more integrated circuit die,
        a plurality of alignment die, wherein
            the alignment die comprise fiducial markings on a major surface of the alignment die, and
            the panel has first and second major surfaces;
    encapsulating the one or more integrated circuit die in the panel with an active surface of each integrated circuit die being exposed at the first major surface of the panel; and
    encapsulating the plurality of alignment die in the panel with the major surface of the alignment die being exposed at the second major surface of the panel, wherein
        the fiducial markings are exposed at the second major surface of the panel, and
        said encapsulating the integrated circuit die and the plurality of alignment die is performed using an encapsulant.

2. The method of claim 1 further comprising:
    exposing the major surface of the alignment die, wherein said exposing results in the alignment die fiducials filled with encapsulant.

3. The method of claim 2 wherein
    said exposing comprises performing a backgrind of the second major surface of the panel; and
    the backgrind is performed to a depth sufficient to expose the major surface of the alignment die and less than a depth of the fiducial markings on the major surface of the alignment die.

4. The method of claim 2 wherein the major surface of the alignment die comprises a material having high contrast with the encapsulant filling the fiducials.

5. The method of claim 4 wherein the major surface material of the alignment die comprises one of silicon, metal, and a dielectric.

6. The method of claim 1 further comprising:
    exposing the major surface of the alignment die, wherein said exposing comprises performing said encapsulating the plurality of alignment die such that an encapsulation thickness is the alignment die thickness.

7. The method of claim 6 further comprising:
    forming the fiducial markings using one of laser drilling, engraving, or molding.

8. The method of claim 6 further comprising:
    pre-filling the fiducial markings with a material that provides a high contrast with the major surface of the alignment die.

9. The method of claim 1 wherein said forming the panel further comprises:
    placing the plurality of alignment die in a plurality of corresponding areas for the panel; and
    forming the fiducial markings on the major surface of each of the alignment die subsequent to said placing.

10. The method of claim 9 wherein said forming comprises using a laser drill.

11. The method of Clam 9 wherein said forming provides fiducial markings having an aspect ratio of a width of the fiducial markings to a depth of the fiducial markings of less than one.

12. The method of claim 1 wherein said forming the panel further comprises:
    placing the plurality of alignment die in a plurality of corresponding areas for the panel, wherein the fiducial markings are provided on the alignment die prior to said placing.

13. The method of claim 12 wherein the alignment die are molded with the fiducial markings.

14. The method of claim 1 wherein the plurality of alignment die have a thickness between the major surface of the alignment die and the first major surface of the panel that is greater than a thickness of the plurality of integrated circuit die.

15. The method of claim 2 wherein, prior to said exposing the major surface of the plurality of alignment die, the plurality of alignment die have a thickness between the major surface of the alignment die and the first major surface of the panel that is greater than a thickness of the panel between the first and second major surfaces of the panel subsequent to said exposing.

16. The method of claim 1 wherein the plurality of alignment die comprises two alignment die.

17. The method of claim 1 further comprising:
filling the alignment die fiducials with a material having an optical contrast with a material comprising the major surface of the alignment die, wherein said filling is performed prior to said encapsulating the plurality of alignment die in the panel.

18. The method of claim 1 wherein the alignment die are one of active die having an active surface opposing the major surface of the alignment die, or dummy die having no active surface opposing the major surface of the alignment die.

19. The method of claim 1 further comprising:
forming a dielectric layer over the second major surface of the panel;
forming a plurality of holes in the dielectric layer to expose conductive structures accessible on the second major surface of the panel, wherein said forming the plurality of holes is performed using the alignment die fiducial markings for alignment of the holes; and
forming one or more electrical interconnects over the second major surface of the panel, using the plurality of holes.

20. A method for packaging integrated circuit die, the method comprising:
forming a panel comprising
a plurality of alignment die, wherein
the alignment die comprise alignment markings on a major surface of the alignment die, and
the panel has first and second major surfaces;
forming the alignment markings on the alignment die by one of drilling, laser drilling, molding, or printing; and
encapsulating the plurality of alignment die in the panel with the major surface of the alignment die being exposed at the second major surface of the panel, wherein
the fiducial markings are exposed at the second major surface of the panel, and
the fiducial markings contrast with the major surface of the alignment die subsequent to being exposed.

\* \* \* \* \*